(12) United States Patent
Koudate

(10) Patent No.: US 12,556,183 B2
(45) Date of Patent: Feb. 17, 2026

(54) BREAKDOWN-VOLTAGE CONTROL CIRCUIT

(71) Applicant: RENESAS ELECTRONICS CORPORATION, Tokyo (JP)

(72) Inventor: Kazuhiro Koudate, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 50 days.

(21) Appl. No.: 18/485,606

(22) Filed: Oct. 12, 2023

(65) Prior Publication Data
US 2024/0171176 A1 May 23, 2024

(30) Foreign Application Priority Data

Nov. 17, 2022 (JP) .................. 2022-183949

(51) Int. Cl.
| | |
|---|---|
| H03K 19/00 | (2006.01) |
| H03K 17/0812 | (2006.01) |
| H03K 19/003 | (2006.01) |
| H03K 19/0185 | (2006.01) |

(52) U.S. Cl.
CPC . H03K 19/00315 (2013.01); H03K 17/08122 (2013.01); H03K 19/0027 (2013.01); H03K 19/018507 (2013.01)

(58) Field of Classification Search
CPC ....... H03K 19/00315; H03K 17/08122; H03K 19/0027; H03K 19/018507; H03K 17/223; H03K 17/0822; H03K 17/687; H03K 19/018521; H03K 17/102; H03K 17/6871
See application file for complete search history.

(56) References Cited

U.S. PATENT DOCUMENTS

| | | | | |
|---|---|---|---|---|
| 3,512,100 | A * | 5/1970 | Killion | H03F 1/523 330/277 |
| 5,973,534 | A * | 10/1999 | Singh | H03K 17/102 327/309 |
| 6,040,968 | A * | 3/2000 | Duvvury | H10D 89/601 361/56 |
| 8,994,412 | B2 * | 3/2015 | Kim | H03K 3/356165 327/109 |
| 9,614,529 | B1 * | 4/2017 | Chen | H03K 19/018507 |
| 10,637,446 | B1 * | 4/2020 | Mathur | H04B 1/18 |
| 10,734,083 | B2 * | 8/2020 | Wu | G05F 3/24 |
| 11,258,435 | B2 * | 2/2022 | Kim | H03K 3/356113 |

(Continued)

FOREIGN PATENT DOCUMENTS

JP 2005-039560 A 2/2005

Primary Examiner — Tuan T Lam
(74) Attorney, Agent, or Firm — Rimon P.C.

(57) ABSTRACT

A breakdown-voltage control circuit includes a high voltage monitor circuit and a first voltage switching circuit 1112 connected to the high voltage monitor circuit, the high voltage monitor circuit generating a first reference signal based on an input signal inputted to the high voltage monitor circuit, the first voltage switching circuit comparing a first application voltage applied to the first voltage switching circuit with the first reference signal, outputting the first reference signal as a first control signal when the first application voltage is exceeded, and outputting the first application voltage as the first control signal when the voltage of the first reference signal is less than the first application voltage.

5 Claims, 12 Drawing Sheets

(56) References Cited

U.S. PATENT DOCUMENTS

| | | | | |
|---|---|---|---|---|
| 11,444,611 | B2* | 9/2022 | Ma | H03K 17/6874 |
| 11,451,197 | B2* | 9/2022 | Li | H03K 5/24 |
| 11,462,903 | B2* | 10/2022 | Lai | G11C 16/14 |
| 11,569,819 | B1* | 1/2023 | Shah | H03K 19/00315 |
| 11,646,737 | B1* | 5/2023 | Chan | H03K 19/00361 |
| | | | | 327/333 |
| 11,652,477 | B2* | 5/2023 | Huang | H03K 19/00346 |
| | | | | 327/540 |
| 11,962,307 | B2* | 4/2024 | Wang | H03K 5/24 |
| 2010/0271118 | A1* | 10/2010 | Bhattacharya | H03K 19/018528 |
| | | | | 327/543 |
| 2019/0149149 | A1* | 5/2019 | Pan | H03K 19/018585 |
| | | | | 327/109 |
| 2021/0409020 | A1* | 12/2021 | Singrigowda | H03K 17/08122 |
| 2022/0158446 | A1* | 5/2022 | Lai | H02H 9/046 |
| 2023/0238956 | A1* | 7/2023 | Chen | H03K 3/356113 |
| | | | | 327/205 |

* cited by examiner

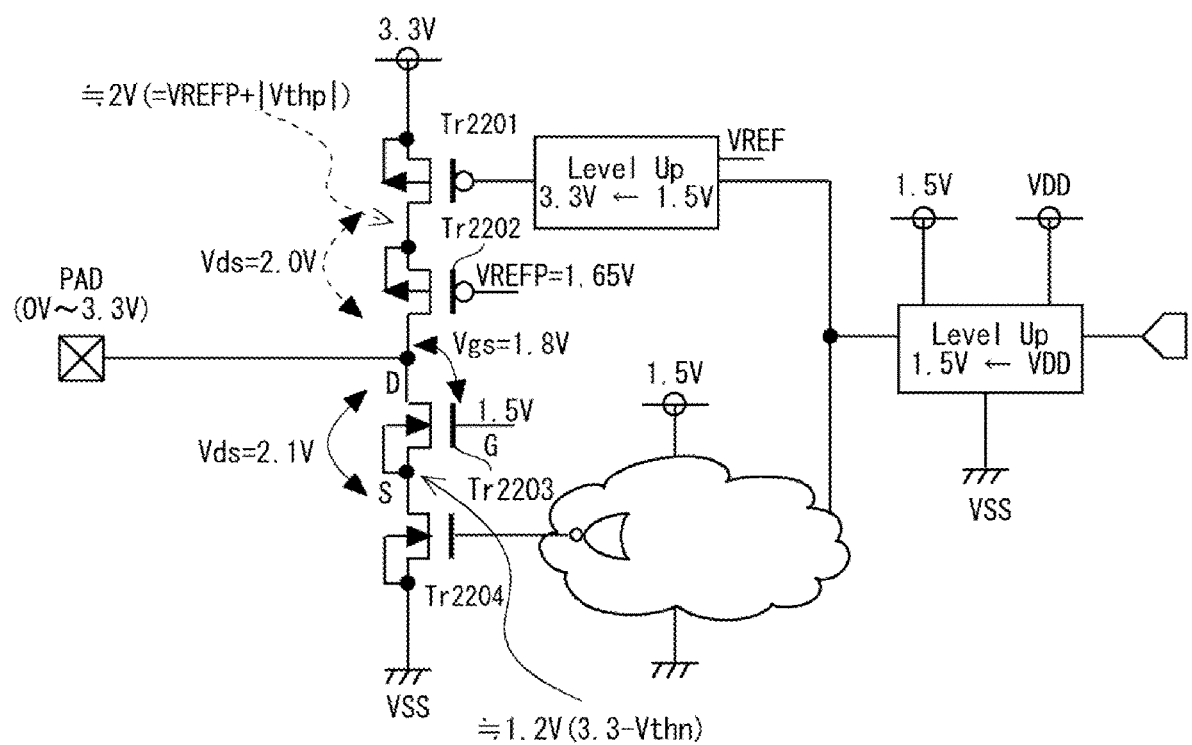

BREAKDOWN-VOLTAGE CONTROL CIRCUIT

CROSS-REFERENCE TO RELATED APPLICATIONS

The present application claims priority from Japanese Patent Application No. 2022-183949 filed on Nov. 17, 2022, the content of which is hereby incorporated by reference to this application.

BACKGROUND

The present disclosure relates to a breakdown-voltage control circuit, particularly, to a breakdown-voltage control circuit capable of realizing a high voltage input/output in an input/output circuit using a low breakdown-voltage device.

In recent years, with miniaturization of a manufacturing process of electronic devices, it has become difficult to guarantee reliability of a HCI (Hot Carrier Injection)/NBTI (Negative Bias Temperature Instability) and the like, which makes it difficult to manufacture high voltage transistors. Looking at past trends, 3.3 V (volts) or 2.5 V (OverDrive 3.3 V)-MOS has been used before 28 nm (nanometers), 1.8 V-MOS has been used until 7 nm, 1.2 V (OverDrive 1.5 V)-MOS has been used after 5 nm, and a low breakdown voltage of an IO transistor has progressed. Meanwhile, even in products by an advanced process, there is a demand for a high voltage I/O such as a 3.3 V-I/F (Interface). In contrast, such a demand is realized by a multi-stage stacked circuit of IO transistors. In the multi-stage stacked circuit of the IO transistor, the IO transistor having a breakdown voltage (1.8 V) more than half of a 3.3 V power supply until 7 nm has been capable of being used, so that the 3.3 V-I/F has been capable of being realized by a two-stage stacked circuit. However, after 5 nm, the breakdown voltage (1.2 V or 1.5 V) is less than half that of the 3.3 V power supply, so that the three-stage stacked circuit of the IO transistor whose breakdown voltage has been lowered is required, and a problem arises in that a high voltage input/output must be realized in the three-stage stacked circuit.

There is a disclosed technique listed below. [Patent Document 1] Japanese Unexamined Patent Application Publication No. 2005-39560

Patent Document 1 discloses a circuit capable of suppressing amplitudes of signals, which is outputted to a plurality of connection points, to less than half a power supply voltage by setting a first intermediate voltage, which is applied to a gate terminal of an N-channel type transistor, to a voltage higher than half the power supply voltage by a threshold voltage and by setting a second intermediate voltage, which is applied to a gate terminal of a P-channel type transistor, to a voltage lower than half the power supply voltage by the threshold voltage. The circuit disclosed in Patent Document 1 is the two-stage stacked circuit, and the high voltage input/output (3.3 V-I/F) is not disclosed.

SUMMARY

As described above, there is a problem in that the high-voltage input/output must be realized in the three-stage stacked circuit of the IO transistor whose breakdown voltage has been lowered.

Other problems and novel features will be apparent from the description of the present specification and the accompanied drawings.

According to one embodiment, a breakdown-voltage control circuit (input side) includes: a high voltage monitor circuit; and a first voltage switching circuit connected to the high voltage monitor circuit. The high voltage monitor circuit generates a first reference signal based on an input signal inputted to the high voltage monitor circuit, and the first voltage switching circuit outputs, as a first control signal, the higher voltage out of a first application voltage applied to the first voltage switching circuit and the first reference signal.

According to another embodiment, a breakdown-voltage control circuit (output side) includes: a high voltage monitor circuit; a first voltage switching circuit connected to the high voltage monitor circuit; and a second voltage switching circuit connected to the high voltage monitor circuit. The high voltage monitor circuit generates a first reference signal and a second reference signal based on an output signal of a high voltage output circuit, which is connected to a subsequent stage of the breakdown-voltage control circuit and is fed back and inputted from the high voltage output circuit, and the first voltage switching circuit outputs, as a control signal, the higher voltage out of a first application voltage applied to the first voltage switching circuit and the first reference signal. The second voltage switching circuit outputs, as a second control signal, the higher voltage out of a second application voltage applied to the second voltage switching circuit and the second reference signal.

According to the embodiment, the breakdown-voltage control circuit capable of realizing the high voltage input/output in the input/output circuit using the low breakdown-voltage device can be provided.

BRIEF DESCRIPTION OF THE DRAWINGS

FIG. 2B is a circuit diagram illustrating an output circuit of the conventional technique.

DETAILED DESCRIPTION

Figure 1:
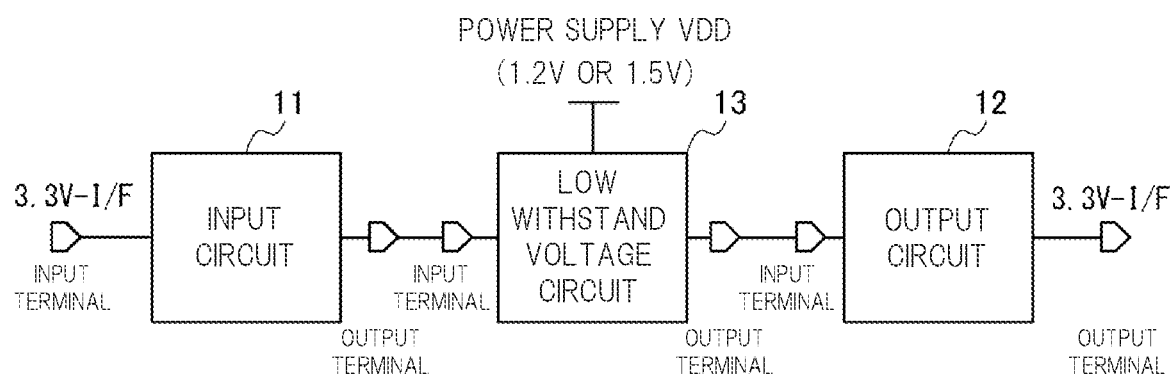
FIG. 1 is a block diagram illustrating an input circuit, an output circuit, and a low breakdown-voltage circuit.

For clarity of explanation, the following descriptions and drawings are omitted and simplified appropriately. In addition, each element described in the drawings as a functional block that performs various processings can be configured with a CPU (Central Processing Unit), a memory, and other circuits in terms of hardware, and be realized by a program and the like loaded in the memory in terms of software. Therefore, those skilled in the art will understand that these functional blocks can be realized in various forms by hardware only, software only, or a combination thereof, and the present invention is not limited to either one. Incidentally, in each drawing, the same elements are denoted by the same reference numerals, and a redundant description will be omitted as necessary.

Also, the above-described program can be stored and supplied to a computer by using various types of non-transitory computer-readable media. The non-transitory computer-readable media include various types of tangible storage media. Examples of the non-transitory computer-readable media include magnetic recording media (for example, flexible discs, magnetic tapes, hard disk drives), magneto-optical recording media (for example, magneto-optical discs), CD-ROMs (Read Only Memory), CD-Rs, CD-R/W, semiconductor memories (for example, mask ROMs, PROMs (Programmable ROM), EPROMs (Erasable PROM), flash ROMs, RAMs (Random Access Memory)). The program may also be supplied to the computer by various types of transitory computer-readable media. Examples of the transitory computer-readable media include electrical signals, optical signals, and electromagnetic waves. The transitory computer-readable media can supply the program to the computer via wired channels such as wires and optical fibers, or wireless channels.

CONVENTIONAL TECHNIQUE

Problems and Solutions Thereof

First, problems and their solutions of an input circuit and an output circuit will be described.

FIG. 1 is a block diagram illustrating an input circuit, an output circuit, and a low breakdown-voltage circuit.

As shown in FIG. 1, processing circuits for processing signals have come to use low voltage transistors as a manufacturing process of electronic devices has become finer. In that sense, the processing circuit is referred to as a low breakdown-voltage circuit 13. An input circuit 11 is provided on an input side of the low breakdown-voltage circuit 13, and an output circuit 12 is provided on an output side. The signals are inputted to the input circuit 11 from an input terminal of the input circuit 11 and outputted from an output terminal of the input circuit 11. The signals outputted from the output terminal of the input circuit 11 are inputted to the low breakdown-voltage circuit 13 from the input terminal of the low breakdown-voltage circuit 13 and is outputted from the output terminal of the low breakdown-voltage circuit 13. The signals outputted from the output terminal of the low breakdown-voltage circuit 13 is inputted to the output circuit 12 from the input terminal of the output circuit 12 and is outputted from the output terminal of the output circuit 12. Here, an input/output interface with an outside is determined by a standard and, for example, it is necessary to correspond to a 3.3 V-I/F with a high breakdown voltage. Each of the input circuit 11 and the output circuit 12 uses a low breakdown-voltage transistor and, simultaneously, uses, for example, a three-stage stacked circuit, in which the transistors are stacked vertically in three stages, in order to handle the high-voltage 3.3 V-I/F.

Figure 2A:
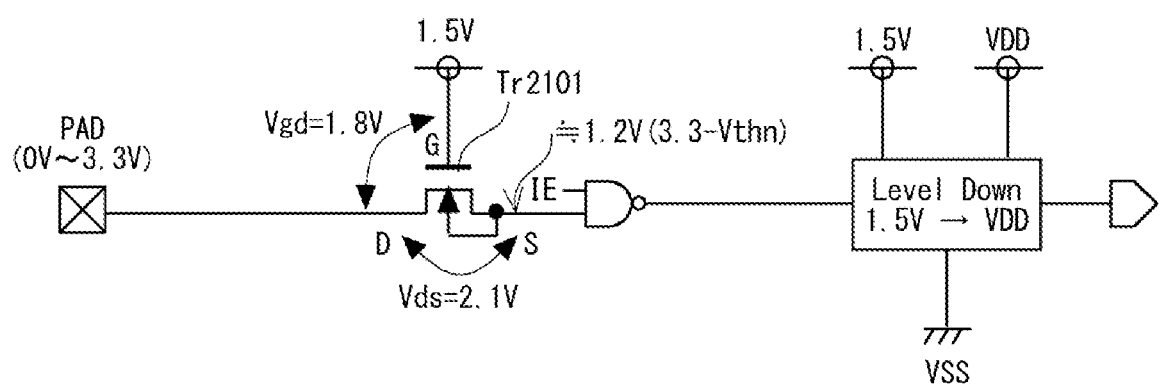
FIG. 2A is a circuit diagram illustrating an input circuit of a conventional technique.

FIG. 2A is a circuit diagram illustrating an input circuit of a conventional technique.

FIG. 2B is a circuit diagram illustrating an output circuit of the conventional technique.

In FIGS. 2A and 2B and subsequent drawings, it will be described as an example that an IO-MOS (Metal-Oxide-Semiconductor) using 1.2 V (OverDrive 1.5 V)-MOS with a lower breakdown voltage than 1.8 V-MOS is used as an I/O transistor.

As shown in FIG. 2A, in the input circuit of the conventional technique, at a time of a PAD=High (3.3 V) input, a gate-drain voltage Vgd of a transistor Tr2101 becomes Vgd=1.8 V (volt), and MOS breakdown-voltage violation occurs. Also, at the time of the PAD=High input, a drain-source voltage Vds of the transistor Tr2101 becomes Vds=2.1 V, and the MOS breakdown-voltage violation occurs. Further, at a time of a PAD=Low (0.0 V) input, no MOS breakdown-voltage violation occurs.

As shown in FIG. 2B, in the output circuit of the conventional technique, at a time of a PAD=High (3.3 V) output, a gate-source voltage Vgs of a transistor Tr2203 becomes Vgs=1.8 V, and the MOS breakdown-voltage violation occurs. Further, at the time of outputting PAD=High, a drain-source voltage Vds of the transistor Tr2203 becomes Vds=2.1 V, and the MOS breakdown-voltage violation occurs. In addition, at a time of a PAD=Low (0.0 V) output, a drain-source voltage Vds of a transistor Tr2202 is Vds=2.0 V, and the MOS breakdown-voltage violation occurs.

In this way, the MOS breakdown-voltage violation occurs in a two-stage stacked circuit of the IO transistor used in the input circuit and the output circuit of the conventional technique. Therefore, in a first embodiment, a three-stage stacked circuit in which the number of stages of transistors is increased to three is used in order to prevent the breakdown-voltage violation of the transistor.

First Embodiment

In a first embodiment, the three-stage stacked circuit in which the number of stages of the IO transistor is increased to three is used.

Input Circuit

Figure 3:
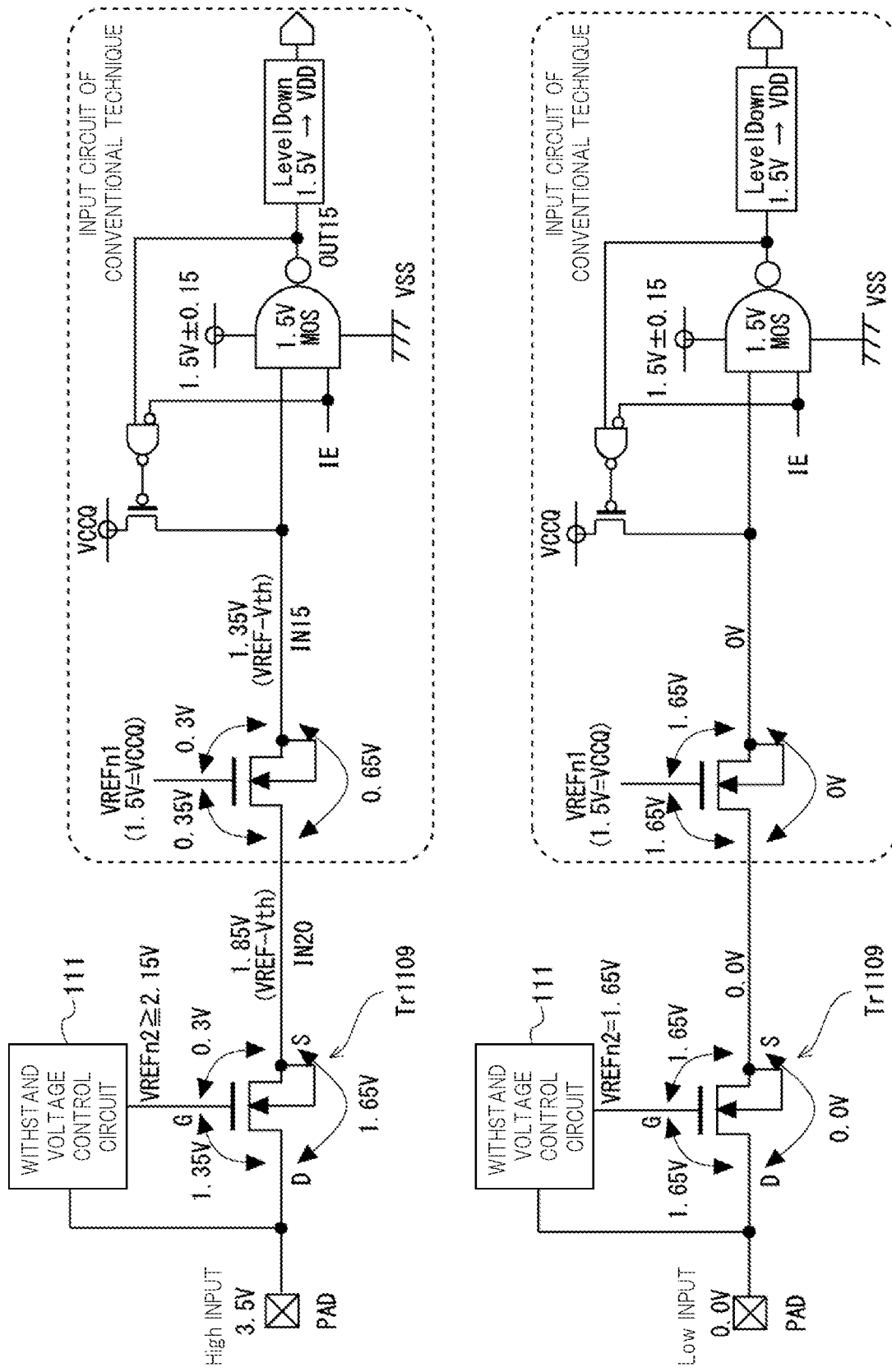
FIG. 3 is a circuit diagram illustrating an input circuit according to a first embodiment.

FIG. 3 is a circuit diagram illustrating an input circuit according to a first embodiment.

An upper stage of FIG. 3 shows a state in which PAD=High (3.5 V) is inputted.

A lower stage of FIG. 3 shows a state in which PAD=Low (0.0 V) is inputted.

As shown in FIG. 3, at the time of the PAD=High (3.5 V) input, when a first control signal applied to a gate of a ninth semiconductor element Tr1109≥2.15 V, a gate-drain voltage Vgd of the ninth semiconductor element Tr1109 becomes Vgd=1.35 V, a drain-source voltage Vds becomes Vds=1.65 V, a gate-source voltage Vgs becomes Vgs=0.3 V, and the MOS breakdown-voltage violation does not occur. Incidentally, the first control signal may also be referred to as a reference VREFn2.

As shown in FIG. 3, at the time of the PAD=Low (0.0 V) input, when the first control signal applied to the gate of the ninth semiconductor element Tr1109≥1.65 V, the gate-drain voltage Vgd of the ninth semiconductor element Tr1109 becomes Vgd=1.65 V, the drain-source voltage Vds becomes Vds=0.0 V, the gate-source voltage Vgs becomes Vgs=1.65 V, and the MOS breakdown voltage violation does not occur.

Therefore, a breakdown-voltage control circuit 111 outputs the first control signal as the first control signal≥2.15 V at the time of the PAD=High (3.5 V) input, and outputs it as the first control signal=1.65 V at the time of the PAD=Low (0.0 V) input. thereby making it possible to prevent the MOS breakdown-voltage violation from occurring.

Breakdown-Voltage Control Circuit

Figure 4:
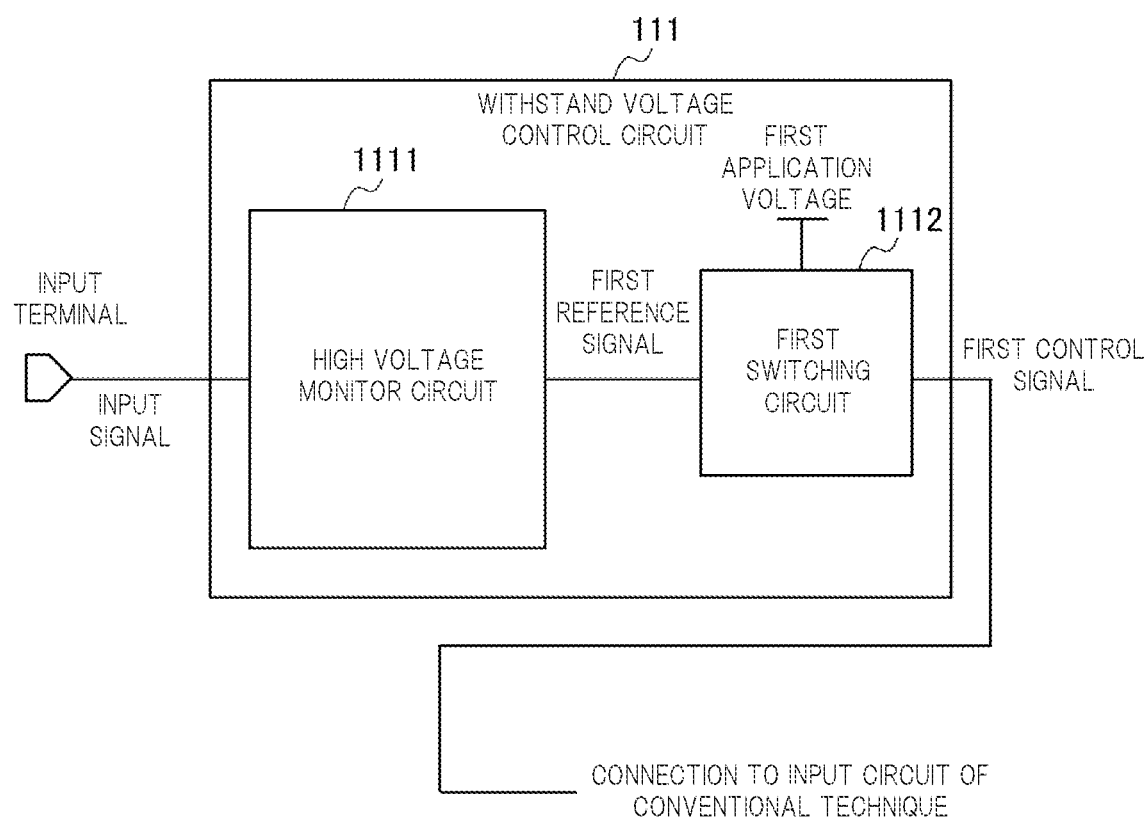
FIG. 4 is a circuit diagram illustrating a breakdown-voltage control circuit of the input circuit according to the first embodiment.

FIG. 4 is a circuit diagram illustrating a breakdown-voltage control circuit of the input circuit according to the first embodiment.

FIG. 4 is the circuit diagram of the breakdown-voltage control circuit for generating the first control signal shown in FIG. 3.

FIG. 4 shows an overview of the breakdown-voltage control circuit of the input circuit.

As shown in FIG. 4, the breakdown-voltage control circuit 111 of the input circuit according to the first embodiment includes a high voltage monitor circuit 1111 and a first voltage switching circuit 1112 connected to the high voltage monitor circuit 1111.

The high voltage monitor circuit 1111 generates the first reference signal based on the input signal inputted to the high voltage monitor circuit 1111. A voltage of the input signal at the time of a High input of the input signal is a signal that has a voltage higher than a power supply voltage of the semiconductor element used in the breakdown-voltage control circuit 111 and performs a toggle operation. Therefore, the input signal is also referred to as a high voltage signal.

The first voltage switching circuit 1112 compares a first application voltage, which is applied to the first voltage switching circuit 1112, with the first reference signal outputted from the high voltage monitor circuit 1111. The first voltage switching circuit 1112 outputs the first reference signal as a first control signal when the voltage of the first reference signal exceeds the first application voltage. The first voltage switching circuit 1112 outputs the first application voltage as the first control signal when the voltage of the first reference signal is less than the first application voltage. The first control signal, which is an output of the breakdown-voltage control circuit 111 (first voltage switching circuit 1112), is connected to the input circuit of the conventional technique.

Effects

In the first embodiment, the input circuit uses the low breakdown-voltage transistor and, simultaneously, uses the breakdown-voltage control circuit, in which the transistors are stacked vertically in three stages, in order to handle a high breakdown-voltage interface (for example, 3.3 V-I/F). As a result, it is possible to realize the breakdown-voltage control circuit capable of realizing the high voltage input in the input circuit using a low breakdown-voltage device.

The detailed circuit of the breakdown-voltage control circuit 111 will be described. Incidentally, the transistor is referred to as the semiconductor element.

Figure 5:
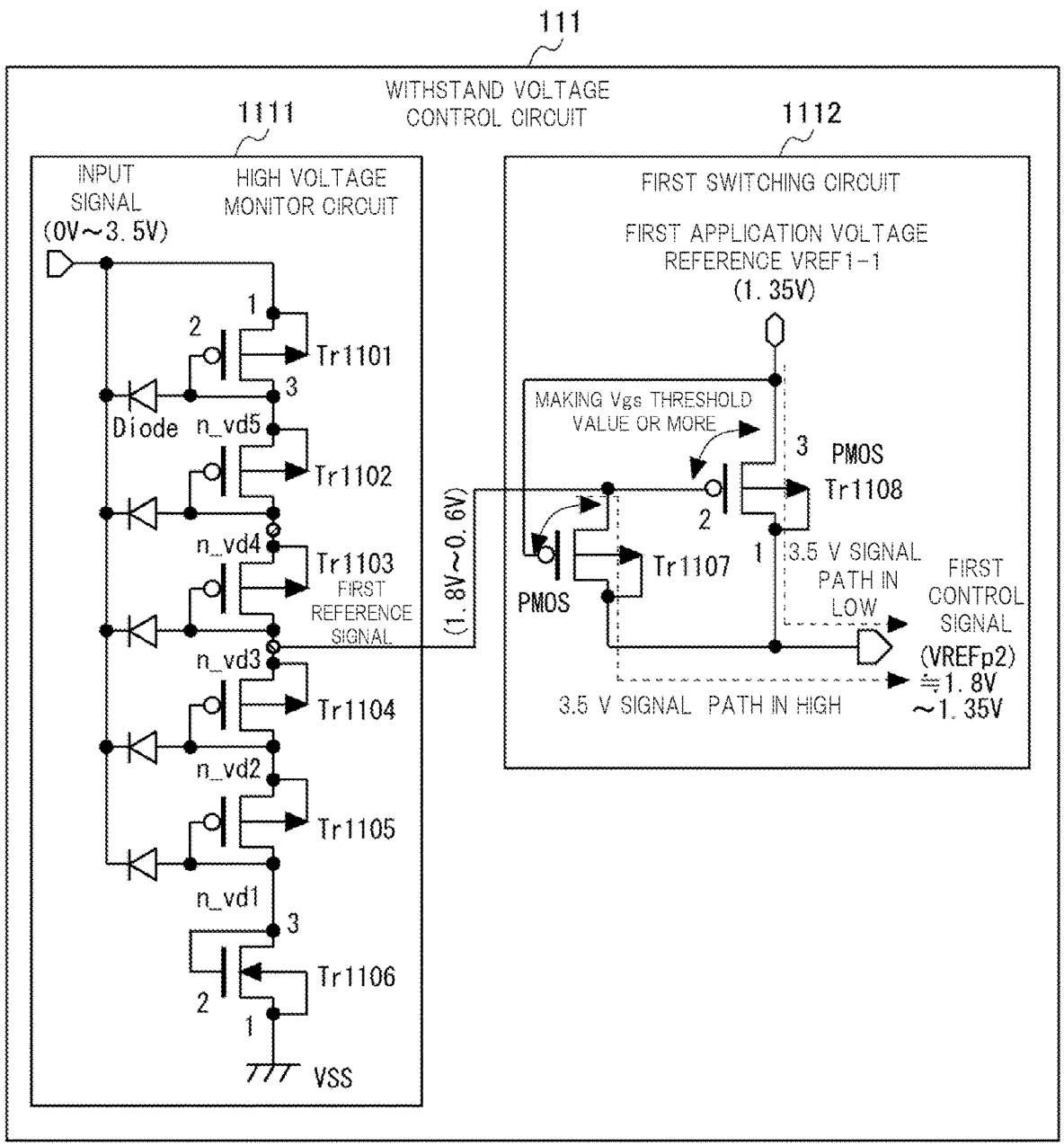
FIG. 5 is a circuit diagram illustrating the breakdown-voltage control circuit of the input circuit according to the first embodiment.

FIG. 5 is a circuit diagram illustrating the breakdown-voltage control circuit of the input circuit according to the first embodiment.

FIG. 5 shows details of the breakdown-voltage control circuit of the input circuit.

As shown in FIG. 5, the breakdown-voltage control circuit 111 includes the high voltage monitor circuit 1111 and the first voltage switching circuit 1112 connected to the high voltage monitor circuit 1111. The high voltage monitor circuit 1111 has a first semiconductor element Tr1101 to a sixth semiconductor element Tr1106.

A first terminal of the first semiconductor element Tr1101 is connected to the input signal. A second terminal of the first semiconductor element Tr1101 is connected to a third terminal of the first semiconductor element Tr1101 and a first terminal of the second semiconductor element Tr1102. A second terminal of the second semiconductor element Tr1102 is connected to a third terminal of the second semiconductor element Tr1102 and a first terminal of the third semiconductor element Tr1103.

A second terminal of the third semiconductor element Tr1103 is connected to a third terminal of the third semiconductor element Tr1103, a first terminal of the fourth semiconductor element Tr1104, and the first reference signal. A second terminal of the fourth semiconductor element Tr1104 is connected to a third terminal of the fourth semiconductor element Tr1104 and a first terminal of the fifth semiconductor element Tr1105.

A second terminal of the fifth semiconductor element Tr1105 is connected to a third terminal of the fifth semiconductor element Tr1105, a third terminal of the sixth semiconductor element Tr1106, and a second terminal of the sixth semiconductor element Tr1106. A first terminal of the sixth semiconductor element Tr1106 is connected to a ground VSS.

The first voltage switching circuit 1112 has a seventh semiconductor element Tr1107 and an eighth semiconductor element Tr1108.

A first terminal of the seventh semiconductor element Tr1107 is connected to a first terminal of the eighth semiconductor element Tr1108 and the first control signal. A second terminal of the seventh semiconductor element Tr1107 is connected to a third terminal of the eighth semiconductor element Tr1108 and the first application voltage. A third terminal of the seventh semiconductor element Tr1107 is connected to a second terminal of the eighth semiconductor element Tr1108 and the first reference signal.

The breakdown voltages of the first semiconductor element Tr1101 to the eighth semiconductor element Tr1108 are lower than the voltage when the input signal is at a High level.

Also, each of the first semiconductor element Tr1101 to the eighth semiconductor element Tr1108 is a field effect transistor. The first terminal is the source, the second terminal is the gate, and the third terminal is the drain. The field effect transistor is a P-type MOSFET (Metal-Oxide-Semiconductor Field-Effect Transistor) or an N-type MOSFET.

A diode is connected between the second terminal of each of the first semiconductor element Tr1101 to the fifth semiconductor element Tr1105 and the input signal.

Features

Features of the breakdown-voltage control circuit of the input circuit will be shown below.

The breakdown-voltage control circuit switches and outputs the first reference signal, which is generated from the high voltage signal such as 3.3 V-I/F, and the first application voltage.

The breakdown voltage of the transistor that configures the breakdown-voltage control circuit is lower than the voltage level of the high voltage signal.

The high voltage signal is a signal performing the toggle operation that alternately repeats High and Low.

The first voltage switching circuit compares the first reference signal and the first application voltage, and outputs the higher voltage as the first control signal.

When the first reference signal>the first application voltage, the seventh semiconductor element Tr1107 is turned on, the eighth semiconductor element Tr1108 is turned off, and the first reference signal is outputted.

When the first reference signal<the first application voltage, the seventh semiconductor element Tr1107 is turned off, the eighth semiconductor element Tr1108 is turned on, and the first application voltage is outputted.

When the first reference signal=the first application voltage, the seventh semiconductor element Tr1107 is turned off and the eighth semiconductor element Tr1108 is turned off, but these states do not matter for not constantly continuing since the toggle operation is premised.

Modification Example of Breakdown-Voltage Control Circuit

Figure 6:
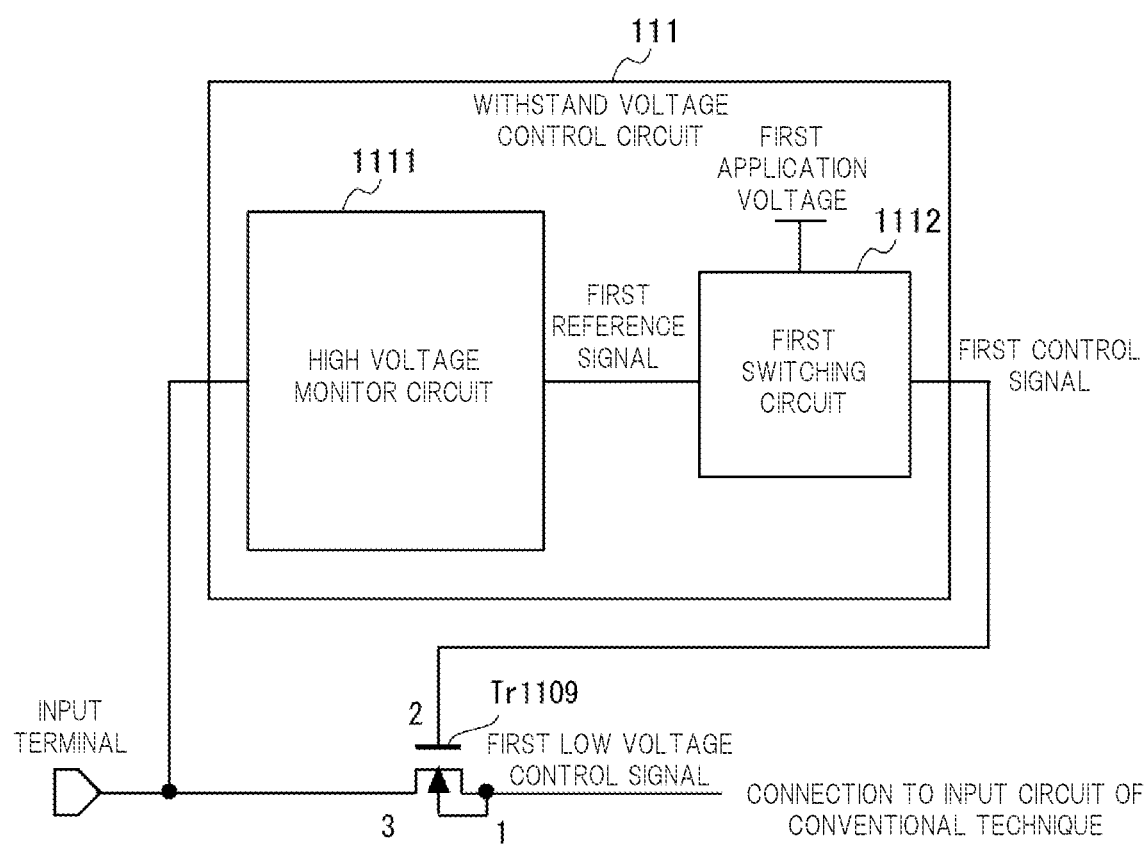
FIG. 6 is a circuit diagram illustrating a modification example of the breakdown-voltage control circuit of the input circuit according to the first embodiment.

FIG. 6 is a circuit diagram illustrating a modification example of the breakdown-voltage control circuit of the input circuit according to the first embodiment.

As shown in FIG. 6, the first control signal is connected to a second terminal of the external ninth semiconductor element Tr1109. The input signal is connected to a third terminal of the ninth semiconductor element Tr1109. The ninth semiconductor element Tr1109 outputs the first low voltage control signal from a first terminal of the ninth semiconductor element Tr1109. The first low voltage control signal is connected to the input circuit (see FIG. 3) of the conventional technique.

The ninth semiconductor element Tr1109 is a field effect transistor. The first terminal is a source, the second terminal is a gate, and the third terminal is a drain. The field effect transistor is a P-type MOSFET (Metal-Oxide-Semiconductor Field-Effect Transistor) or an N-type MOSFET.

Features

Features of the modification example of the breakdown-voltage control circuit will be shown below.

The breakdown-voltage control circuit (modification example) is an input circuit capable of inputting an amplitude signal that is more than twice a voltage capable of being applied to the (field effect) transistor.

An input side of the breakdown-voltage control circuit is connected to the input terminal.

The drain of the ninth semiconductor element Tr1109 is connected to the input terminal. The gate of the ninth semiconductor element Tr1109 is connected to the first control signal on an output side of the breakdown-voltage control circuit. The source of the ninth semiconductor element Tr1109 is connected to the input circuit of the conventional technique.

Second Embodiment

In the first embodiment, the breakdown-voltage control circuit is applied to the input circuit. The breakdown-voltage control circuit can be applied not only to the input circuit but also to the output circuit. In a second embodiment, a case in which the breakdown-voltage control circuit is applied to the output circuit will be described as an example.

Returning to FIG. 2B, at the time of the PAD=High (3.3 V) output, the gate-source voltage Vgs of the transistor Tr2203 becomes Vgs=1.8 V, and the MOS breakdown-voltage violation occurs. Further, at the time of the PAD=High output, the drain-source voltage Vds of the transistor Tr2203 becomes Vds=2.1 V, and the MOS breakdown-voltage violation occurs. Also, at a time of a PAD=Low (0.0 V), the drain-source voltage Vds of the transistor Tr2202 becomes 2.0 V, and the MOS breakdown-voltage violation occurs.

In this way, the MOS breakdown-voltage violation occurs in the two-stage stacked circuit of the IO transistors used in the output circuit of the conventional technique. Therefore, in the second embodiment, a three-stage stacked circuit in which the number of stages of the transistors is increased to three is used in order to prevent the breakdown-voltage violation of the transistors.

Output Circuit

Figure 7:
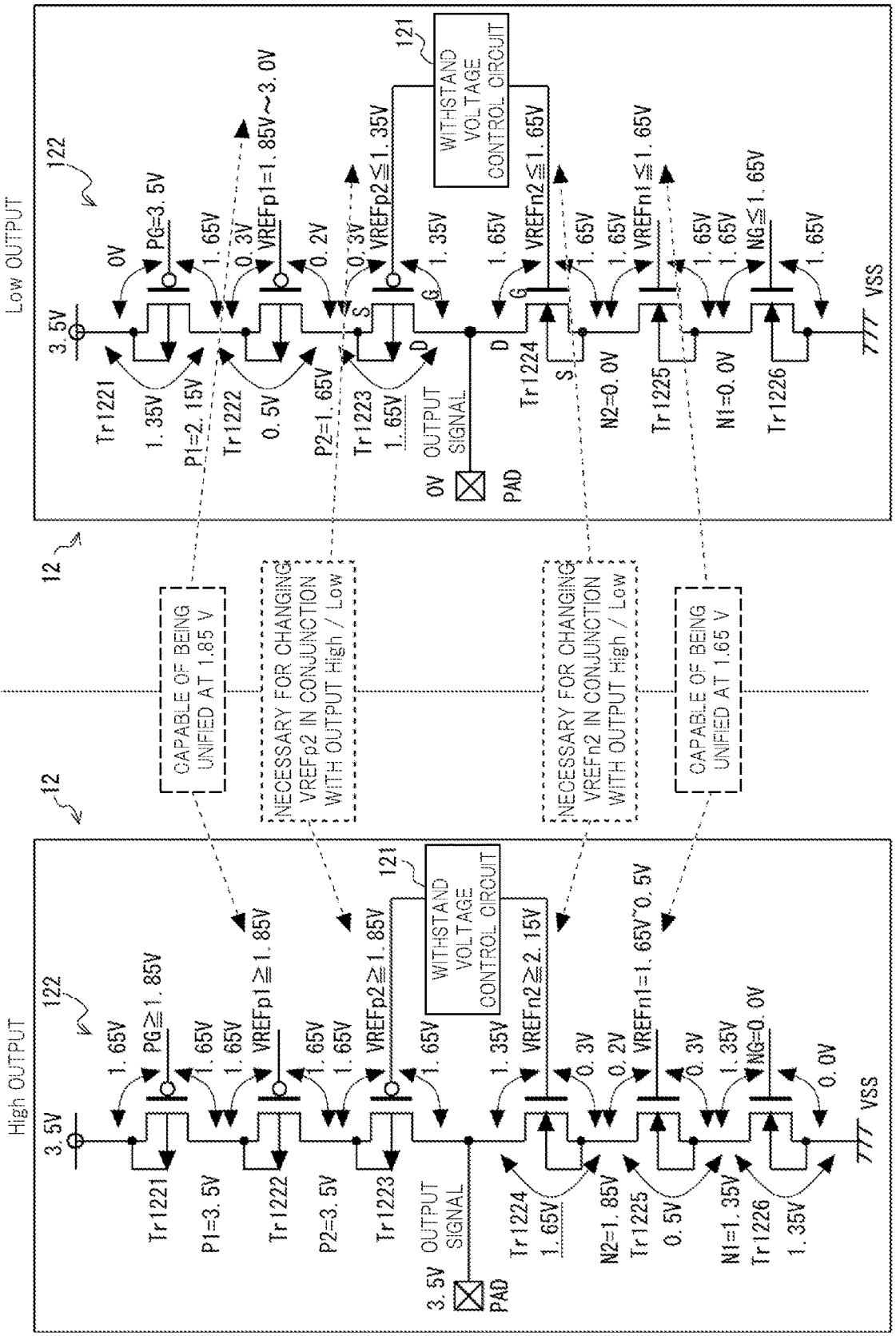
FIG. 7 is a circuit diagram illustrating an output circuit according to a second embodiment.

FIG. 7 is a circuit diagram illustrating an output circuit according to a second embodiment.

FIG. 7 shows a bias voltage required for the three-stage stacked circuit based on the viewpoint of breakdown-voltage protection of the MOS (transistors). Incidentally the 3.3 V power supply premises Vmax=3.5 V.

An upper stage of FIG. 7 shows a time of outputting PAD=Low (0.0 V).

A lower stage of FIG. 7 shows a time of outputting PAD=High (3.5 V).

As shown in the upper stage of FIG. 7, the first control signal applied to the gate of the transistor Tr1223≤1.35 V, the second control signal applied to the gate of the transistor Tr1224≤1.65V, and the voltages applied to the gates of the transistors other than the transistor Tr1223 and the transistor Tr1224 are set as shown in the upper stage of FIG. 7. The first control signal may be referred to as a reference VREFp2 and the second control signal may be referred to as a reference VREFn2.

In this setting, the output of PAD=Low (0.0 V) is obtained, and the gate-drain voltage Vgd, drain-source voltage Vds, and gate-source voltage Vgs of each of the transistors Tr1221 to Tr1226 become below the breakdown voltage, and the MOS breakdown-voltage violation does not occur. For example, the gate-drain voltage Vgd of the transistor Tr1221 becomes Vgd=1.65 V, the drain-source voltage Vds becomes Vds=1.35 V, the gate-source voltage Vgs becomes Vgs=0.0 V, and the MOS breakdown-voltage violation does not occur.

As shown in the lower stage of FIG. 7, the first control signal applied to the gate of the transistor Tr1223≥1.85 V, the second control signal applied to the gate of the transistor Tr1224≥2.15 V, and the gate voltages of the transistors other than the transistor Tr1223 and the transistor Tr1224 are set as shown in the lower stage of FIG. 7.

In this setting, the output of PAD=High (3.5 V) is obtained, and the gate-drain voltage Vgd, drain-source voltage Vds, and gate-source voltage Vgs of each of the transistors Tr1221 to Tr1226 become below the breakdown voltage, and the MOS breakdown-voltage violation does not occur. For example, the gate-drain voltage Vgd of the transistor Tr1221 becomes Vgd=1.65 V, the drain-source voltage Vds becomes Vds=0.0 V, the gate-source voltage Vgs becomes Vgs=1.65 V, and the MOS breakdown voltage violation does not occur.

Here, attention is paid to the transistor Tr1221, the transistor Tr1222, the transistor Tr1225, and the transistor Tr1226. The requirements for the MOS breakdown-voltage violation not to occur can be understood as follows: both at the time of the PAD=Low (0.0 V) output and at the time of the PAD=High (3.5 V) output; the gate voltage of the transistor Tr1221 is set to 3.5 V; the gate voltage of the transistor Tr1222 is set to 1.85 V; the gate voltage of transistor Tr1225 is set to 1.65 V; and the gate voltage of transistor Tr1226 is set to 0.0 V.

Also, attention is paid here to the transistor Tr1223 and the transistor Tr1224. The requirements for the MOS breakdown-voltage violation not to occur can be understood as follows: the gate voltage of the transistor Tr1223 is set to 1.35 V or less at the time of the PAD=Low (0.0 V) output, and to 1.85 V or more at the time outputting PAD=High (3.5

V). The requirements can be understood as follows: the gate voltage of the transistor Tr1224 is set to 1.65 V or less at the time of the PAD=Low (0.0 V) output, and to 2.15 V or more at the time of the PAD=High (3.5 V) output.

In this way, the gate voltage of the transistor Tr1223 and the gate voltage of the transistor Tr1224 need to be controlled by the breakdown-voltage control circuit at the time of the PAD=High (3.5 V) output and at the time of the PAD=Low (0.0 V) output.

Figure 8:
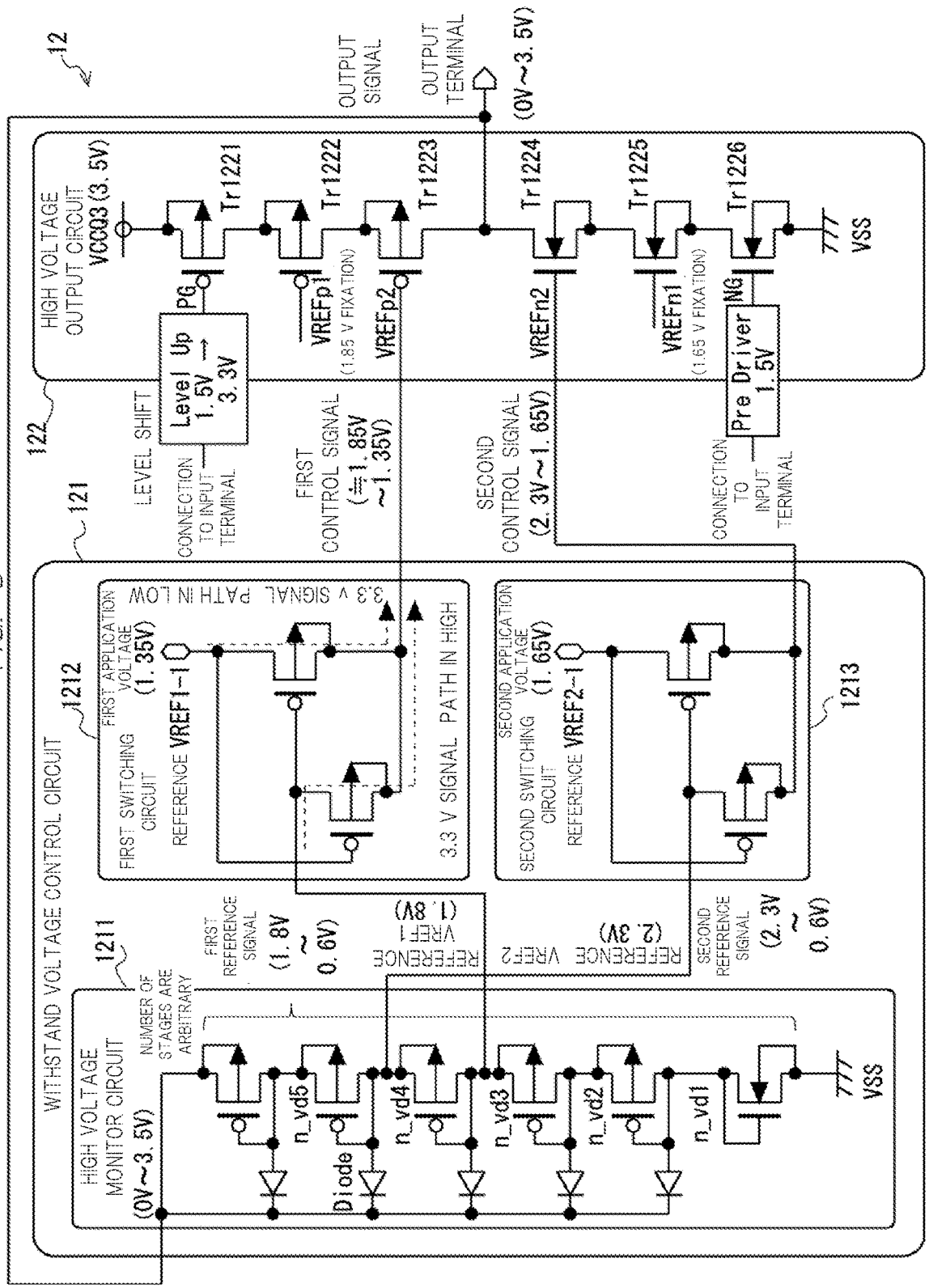
FIG. 8 is a circuit diagram illustrating the output circuit according to the second embodiment.

FIG. 8 is a circuit diagram illustrating an output circuit according to the second embodiment.

FIG. 8 shows details of the output circuit.

As shown in FIG. 8, the output circuit 12 includes a breakdown-voltage control circuit 121 and a high voltage output circuit 122. The breakdown-voltage control circuit 121 has a high voltage monitor circuit 1211, and voltage switching circuits (first voltage switching circuit 1212 and second voltage switching circuit 1213). The high voltage output circuit is also referred to as a 3.3 V output circuit (or 3.5 V output circuit). The high voltage monitor circuit is also referred to as an output voltage monitor circuit. The voltage switching circuit is also referred to as a VREF switching circuit.

In order to prevent the breakdown-voltage violation of the MOS that configures the high voltage output circuit 122, it is necessary to switch a voltage value of the reference voltage VERF in conjunction with a voltage level of the output signal. The requirements for the reference voltage VERF are as follows:

Reference VREFp2≥1.85 V (at the time of the High output);

Reference VREFp2≤1.35 V (at the time of the Low output);

Reference VREFn2≥2.15 V (at the time of the High output); and

Reference VREFn2≤1.65 V (at time of the Low output).

The high voltage monitor circuit 1211 divides the output signal (3.3 V output) High from the high voltage output circuit 122, and generates an arbitrary reference voltage. What is generated at the time of the Hight output is the higher voltage out of the voltages of the references VREF (VREFp2, VREFn2) required to be switched.

Between each voltage division node (n_vd1 to n_vd5) of the high voltage monitor circuit 1211 and a 3.3 V output node (output terminal), a diode (Diode) for releasing charges when the output signal is 0.0 V is connected. Since there is the diode, the charges disappear from each voltage dividing node when 0.0 V is outputted, and a Low level can be detected in a short time.

The first voltage switching circuit 1212 and the second voltage switching circuit 1213 switch the reference VREF1 (first reference signal) and the reference VREF2 (second reference signal) supplied from the high voltage monitor circuit 1211, and separately prepared reference VREF1-1 (first application voltage) and reference VREF2-1 (second application voltage) in conjunction with a 3.3 V output signal level, and supplies it to the high voltage output circuit 122.

The reference VREF1-1 and the reference VREF2-1 may be power supplies supplied from the outside or be generated from the 3.3 V power supply. Also, a plurality of reference VREF switching circuits may be connected to one high voltage monitor circuit.

Features

Features of the breakdown-voltage control circuit of the output circuit will be shown below.

The output circuit is a circuit outputting an amplitude signal that is more than twice the voltage capable of being applied to the transistor.

The high voltage output circuit has a configuration in which three stages of the PMOS transistors are connected in series between the high voltage power supply and the output terminal and three stages of the NMOS transistors are connected in series between the VSS (GND) and the output terminal.

The gate of the first PMOS (Tr1223) is connected on an output side of the first voltage switching circuit 1212.

The gate of the second PMOS (Tr1222) is connected to a predetermined voltage.

The gate of the third PMOS (Tr1221) is connected on an output side of the level shift circuit, and an input side of the level shift circuit is connected to the input terminal of the output circuit.

The gate of the first NMOS (Tr1224) is connected on an output side of the second voltage switching circuit 1213.

The gate of the second NMOS (Tr1225) is connected to another predetermined voltage.

The gate of the third NMOS (Tr1226) is connected to the input terminal of the output circuit.

The input side of the first voltage switching circuit 1212 is connected to the high voltage monitor circuit 1211. Similarly, the input side of the second voltage switching circuit 1213 is connected to the high voltage monitor circuit 1211.

The first voltage switching circuit 1212 is connected to the first application voltage. Similarly, the second voltage switching circuit 1213 is connected to the second application voltage.

The input side of the high voltage monitor circuit 1211 is connected to the output terminal of the high voltage output circuit 122 of the output circuit 12.

Breakdown-Voltage Control Circuit

Figure 9:
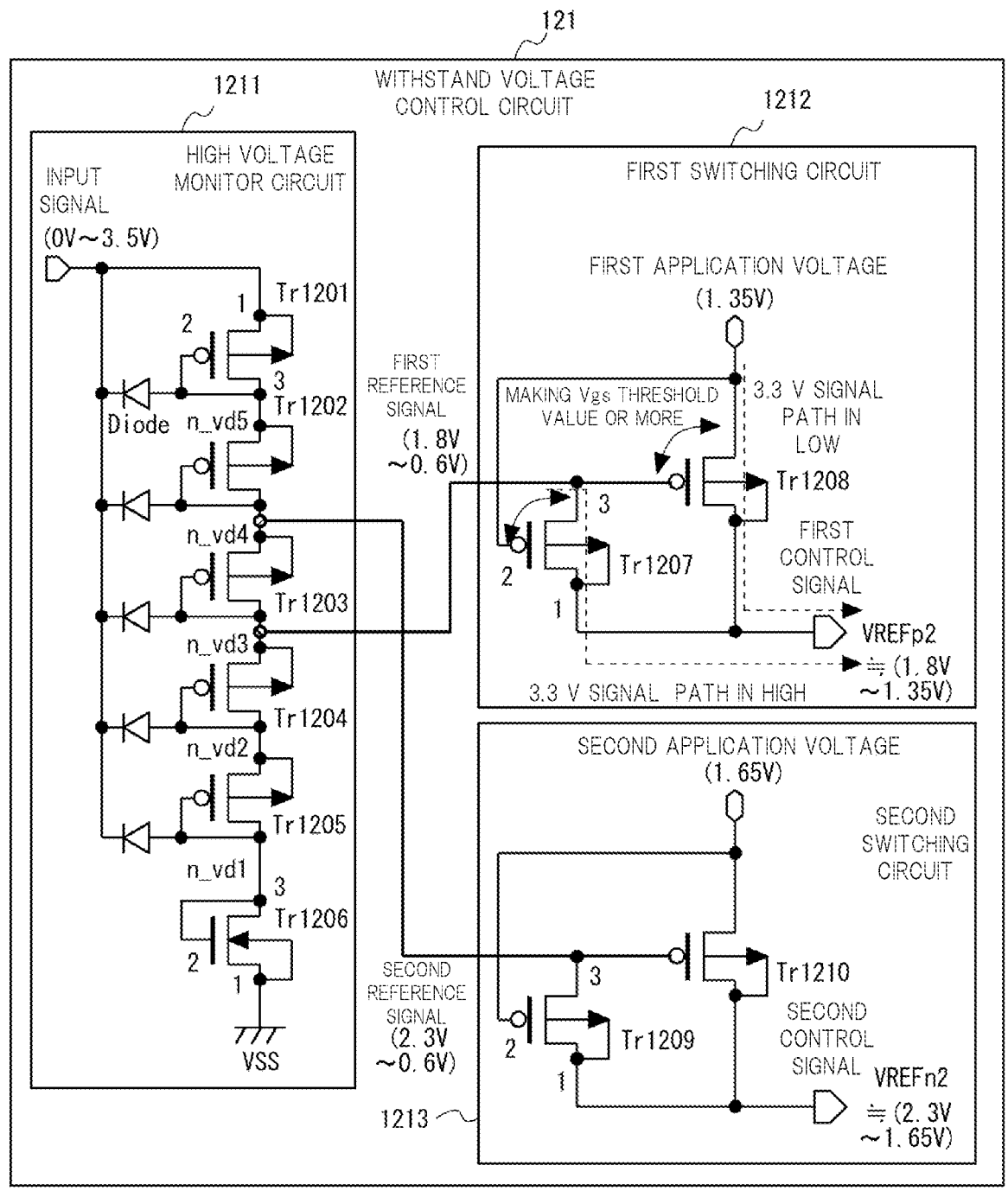
FIG. 9 is a circuit diagram illustrating a breakdown-voltage control circuit of the output circuit according to the second embodiment.

FIG. 9 is a circuit diagram illustrating a breakdown-voltage control circuit of the output circuit according to the second embodiment.

FIG. 9 shows details of the breakdown-voltage control circuit.

As shown in FIG. 9, a breakdown-voltage control circuit 121 of the output circuit according to the second embodiment includes a high voltage monitor circuit 1211, a first voltage switching circuit 1212 connected to the high voltage monitor circuit 1211, and a second voltage switching circuit 1213 connected to the high voltage monitor circuit 1211.

The high voltage monitor circuit 1211 generates the first reference signal and the second reference signal based on the output signal of the high voltage output circuit 122, which is connected to a subsequent stage of the breakdown-voltage control circuit 121 and is fed back and inputted from the high voltage output circuit 122.

The first voltage switching circuit 1212 compares the first application voltage applied to the first voltage switching circuit 1212 with the first reference signal. The first voltage switching circuit 1212 outputs the first reference signal as the first control signal when the voltage of the first reference signal exceeds the first application voltage. The first voltage switching circuit 1212 outputs the first application voltage as the first control signal when the voltage of the first reference signal is less than the first application voltage.

The second voltage switching circuit 1213 compares the second application voltage applied to the second voltage switching circuit 1213 with the second reference signal. The second voltage switching circuit 1213 outputs the second reference signal as the second control signal when the voltage of the second reference signal exceeds the second application voltage. The second voltage switching circuit 1213 outputs the second application voltage as the second control signal when the voltage of the second reference signal is less than the second application voltage.

The high level voltage of the second reference signal is higher than the high level voltage of the first reference signal. The first application voltage is lower than the second application voltage.

Here, the breakdown-voltage control circuit (high voltage monitor circuit and voltage switching circuit) will be explained more specifically.

As shown in FIG. 9, the high voltage monitor circuit 1211 has a first semiconductor element Tr1201 to a sixth semiconductor element Tr1206.

A first terminal of the first semiconductor element Tr 1201 is connected to the output signal of the high voltage output circuit 122. Here, the input signal of the high voltage monitor circuit 1211 of the breakdown-voltage control circuit 121 is the output signal of the high voltage output circuit 122. A second terminal of the first semiconductor element Tr1201 is connected to a third terminal of the first semiconductor element Tr1201 and a first terminal of the second semiconductor element Tr1202. A second terminal of the second semiconductor element Tr1202 is connected to a third terminal of the second semiconductor element, a first terminal of the third semiconductor element Tr1203, and the second reference signal. A second terminal of the third semiconductor element Tr1203 is connected to a third terminal of the third semiconductor element Tr1203, a first terminal of the fourth semiconductor element Tr1204, and the first reference signal.

A second terminal of the fourth semiconductor element Tr1204 is connected to a third terminal of the fourth semiconductor element Tr1204 and a first terminal of the fifth semiconductor element Tr1205. A second terminal of the fifth semiconductor element Tr1205 is connected to a third terminal of the fifth semiconductor element Tr1205, a third terminal of the sixth semiconductor element Tr1206, and a second terminal of the sixth semiconductor element Tr1206. A first terminal of the sixth semiconductor element is connected to the ground VSS.

The first voltage switching circuit 1212 has a seventh semiconductor element Tr1207 and an eighth semiconductor element Tr1208. A first terminal of the seventh semiconductor element Tr1207 is connected to a first terminal of the eighth semiconductor element Tr1208 and the first control signal. A second terminal of the seventh semiconductor element Tr1207 is connected to a third terminal of the eighth semiconductor element Tr1208 and the first application voltage. A third terminal of the seventh semiconductor element Tr1207 is connected to a second terminal of the eighth semiconductor element Tr1208 and the first reference signal.

The second voltage switching circuit 1213 has a ninth semiconductor element Tr1209 and a tenth semiconductor element Tr1210. A first terminal of the ninth semiconductor element Tr1209 is connected to a first terminal of the tenth semiconductor element Tr1210 and the second control signal. A second terminal of the ninth semiconductor element Tr1209 is connected to a third terminal of the tenth semiconductor element Tr1210 and the second application voltage. A third terminal of the ninth semiconductor element Tr1209 is connected to a second terminal of the tenth semiconductor element Tr1210 and the second reference signal.

The breakdown voltage of the first semiconductor element Tr1201 to the tenth semiconductor element Tr1210 is lower than the voltage of the output signal of the high voltage output circuit 122 at the time of the High level.

Also, each of the first semiconductor element Tr1201 to the tenth semiconductor element Tr1210 is a field effect transistor. Also, the first terminal is the source, the second terminal is the gate, and the third terminal is the drain.

Also, the field effect transistor is the P-type MOSFET (Metal-Oxide-Semiconductor Field-Effect Transistor) or the N-type MOSFET.

Further, the diode is connected between the second terminal of each of the first semiconductor element Tr1201 to the fifth semiconductor element Tr1205 and the output signal.

Effects

According to the second embodiment, by detecting the High/Low level of the 3.3 V signal and dynamically switching the bias voltage of the multi-stage MOS circuit, the input/output circuit capable of operating at the power supply voltage that is more than twice the MOS breakdown voltage. circuit can be realized.

Features

Features of the breakdown-voltage control circuit (output circuit) are shown below.

The breakdown-voltage control circuit (output circuit) has a bias voltage switching circuit that has a function of monitoring the High/Low level of the 3.3V signal and switching the bias voltage.

Since the above-mentioned bias voltage switching circuit uses a 1.5 V-MOS, it has a function that does not cause the breakdown-voltage violation in its own circuit.

By combining the bias voltage switching circuit and the multi-stage MOS circuit (for example, 1.5 V-MOS, three-stage stacked), the output circuit capable of operating at the power supply voltage more than twice the MOS breakdown voltage can be realized. The bias voltage switching circuit is also referred to as the voltage switching circuit.

Third Embodiment

Figure 10A:
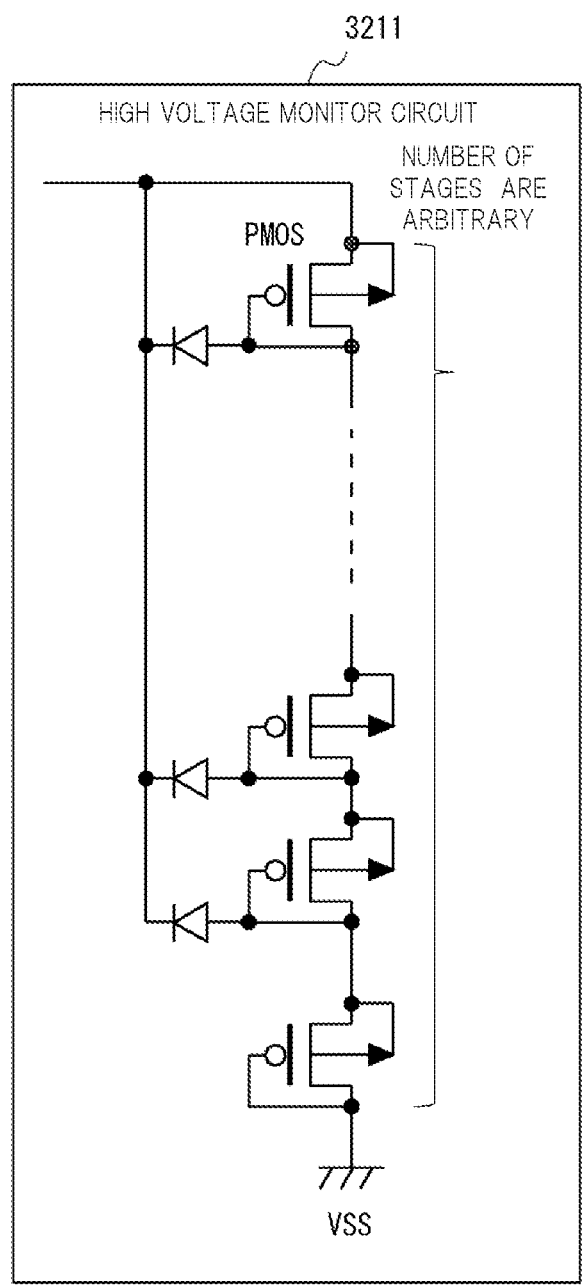
FIG. 10A is a circuit diagram illustrating a high voltage monitor circuit according to a third embodiment.

FIG. 10A is a circuit diagram illustrating a high voltage monitor circuit according to a third embodiment.

FIG. 10A shows the high voltage monitor circuit in using a voltage division circuit by the PMOS.

Figure 10B:
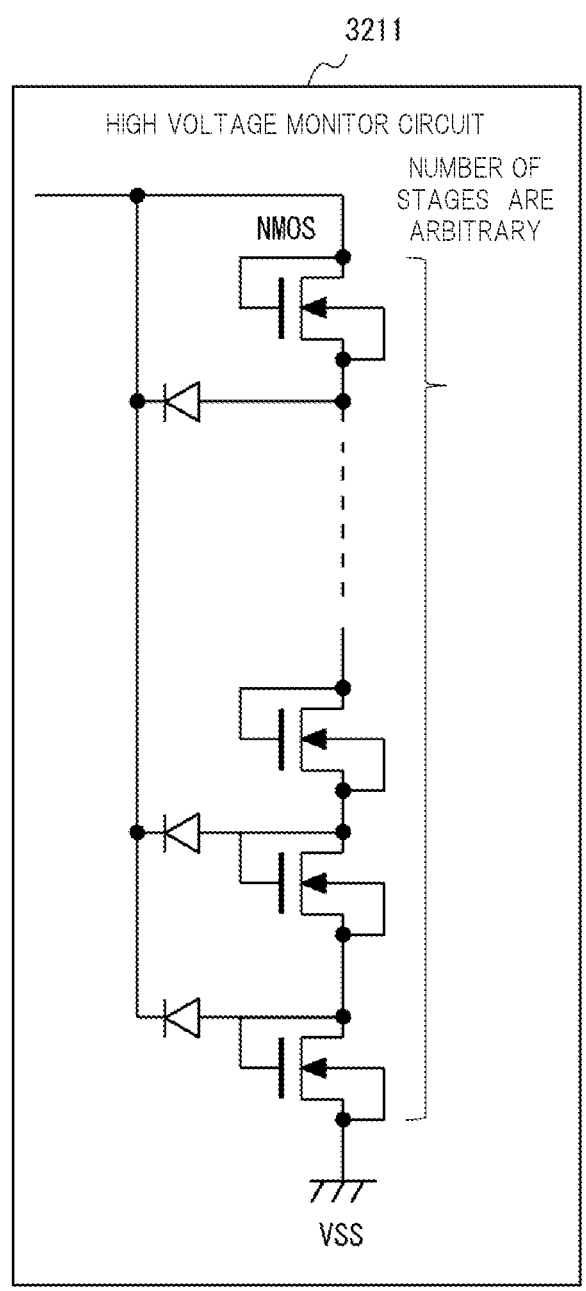
FIG. 10B is a circuit diagram illustrating the high voltage monitor circuit according to the third embodiment.

FIG. 10B is a circuit diagram illustrating the high voltage monitor circuit according to the third embodiment.

FIG. 10B shows the high voltage monitor circuit in using a voltage division circuit by the NMOS.

Figure 10C:
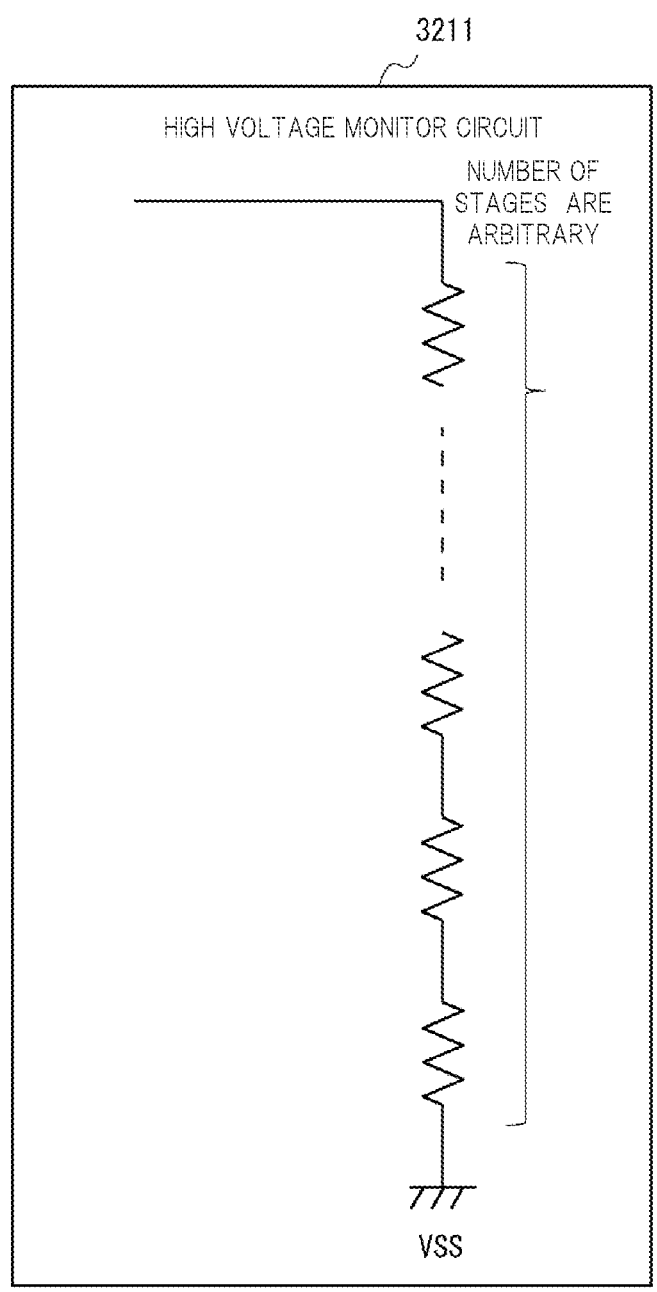
FIG. 10C is a circuit diagram illustrating the high voltage monitor circuit according to the third embodiment.

FIG. 10C is a circuit diagram illustrating the high voltage monitor circuit according to the third embodiment.

FIG. 10C shows the high voltage monitor circuit in using a voltage division circuit by a resistance element.

As shown in FIGS. 10A to 10C, a high voltage monitor circuit 3211 according to a third embodiment is different from the high voltage monitor circuit 1211 according to the first embodiment in that the number of stages of the elements is arbitrary.

Also, the high voltage monitor circuit 3211 may make a type of MOS arbitrary in addition to making the number of stages of the elements arbitrary. The high voltage monitor circuit 3211 selects the arbitrary element from the circuit in which a plurality of elements are stacked in stages, and outputs an output of the selected element as the reference signal. The reference signal is inputted to the subsequent voltage switching circuit. The voltage switching circuit outputs the control signal based on the inputted reference signal and the predetermined application voltage. The high voltage output circuit outputs the high voltage signal based on the control signal.

Also, the resistance element may be used instead of the MOS. Incidentally, in using the resistance element, the charges at the voltage division nodes (n_vd1 to n_vd5) of the high voltage monitor circuit 3211 (see FIG. 8 etc.) escapes, so that active discharge of the charges, which is uses the diode, may be arbitrary.

The invention made by the present inventor has been specifically described above based on the embodiments, but the present invention is not limited to the embodiments already described and, needless to say, can be variously modified without departing from the scope of the invention.

What is claimed is:

1. A breakdown-voltage control circuit comprising:
a high voltage monitor circuit; a first voltage switching circuit connected to the high voltage monitor circuit; and a second voltage switching circuit connected to the high voltage monitor circuit,
wherein the high voltage monitor circuit generates a first reference signal and a second reference signal based on an output signal of a high voltage output circuit, which is connected to a subsequent stage of the breakdown-voltage control circuit and is fed back and inputted from the high voltage output circuit,
wherein the first voltage switching circuit: compares a first application voltage applied to the first voltage switching circuit with the first reference signal; outputs the first reference signal as a first control signal when a voltage of the first reference signal exceeds a first application voltage; and outputs the first application voltage as the first control signal when the voltage of the first reference signal is less than the first application voltage,
wherein the second voltage switching circuit: compares a second application voltage applied to the second voltage switching circuit with the second reference signal; outputs the second reference signal as a second control signal when a voltage of the second reference signal exceeds the second application voltage; and outputs the second application voltage as the second control signal when the voltage of the second reference signal is less than the second application voltage,
wherein a high level voltage of the second reference signal is higher than the high level voltage of the first reference signal, and
wherein the first application voltage is lower than the second application voltage.

2. The breakdown-voltage control circuit according to claim 1,
wherein the high voltage monitor circuit has first to sixth semiconductor elements,
wherein a first terminal of the first semiconductor element is connected to the output signal,
wherein a second terminal of the first semiconductor element is connected to a third terminal of the first semiconductor element and a first terminal of the second semiconductor element,
wherein a second terminal of the second semiconductor element is connected to a third terminal of the second semiconductor element, the first terminal of the third semiconductor element, and the second reference signal,
wherein a second terminal of the third semiconductor element is connected to a third terminal of the third semiconductor element, the first terminal of the fourth semiconductor element, and the first reference signal,
wherein a second terminal of the fourth semiconductor element is connected to a third terminal of the fourth semiconductor element and the first terminal of the fifth semiconductor element,
wherein a second terminal of the fifth semiconductor element is connected to a third terminal of the fifth semiconductor element, the third terminal of the sixth semiconductor element, and the second terminal of the sixth semiconductor element, and
wherein the first terminal of the sixth semiconductor element is connected to the ground,
wherein the first voltage switching circuit has a seventh semiconductor element and an eighth semiconductor element,
wherein the first terminal of the seventh semiconductor element is connected to the first terminal of the eighth semiconductor element and the first control signal,
wherein the second terminal of the seventh semiconductor element is connected to the third terminal of the eighth semiconductor element and the first application voltage, and
wherein the third terminal of the seventh semiconductor element is connected to the second terminal of the eighth semiconductor element and the first reference signal, and
wherein the second voltage switching circuit has a ninth semiconductor element and a tenth semiconductor element,
wherein the first terminal of the ninth semiconductor element is connected to the first terminal of the tenth semiconductor element and the second control signal,
wherein the second terminal of the ninth semiconductor element is connected to the third terminal of the tenth semiconductor element and the second application voltage,
wherein the third terminal of the ninth semiconductor element is connected to the second terminal of the tenth semiconductor element and the second reference signal, and
wherein breakdown voltages of the first to tenth semiconductor elements is lower than the voltage of the output signal at a time the High level.

3. The breakdown-voltage control circuit according to claim 2,
wherein each of the first to tenth semiconductor elements is a field effect transistor, and
wherein the first terminal is a source, the second terminal is a gate, and the third terminal is a drain.

4. The breakdown-voltage control circuit according to claim 3,
wherein the field effect transistor is a P-type MOSFET (Metal-Oxide-Semiconductor Field-Effect Transistor) or an N-type MOSFET.

5. The breakdown-voltage control circuit according to claim 2,
wherein a diode is connected between the second terminal of each of the first to fifth semiconductor elements and the output signal.

* * * * *